(12) United States Patent
Camacho et al.

(10) Patent No.: US 8,558,369 B2
(45) Date of Patent: Oct. 15, 2013

(54) INTEGRATED CIRCUIT PACKAGING SYSTEM WITH INTERCONNECTS AND METHOD OF MANUFACTURE THEREOF

(75) Inventors: Zigmund Ramirez Camacho, Singapore (SG); Henry Descalzo Bathan, Singapore (SG); Frederick Rodriguez Gahilig, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 100 days.

(21) Appl. No.: 13/071,514

(22) Filed: Mar. 25, 2011

(65) Prior Publication Data

US 2012/0241968 A1    Sep. 27, 2012

(51) Int. Cl.
*H01L 25/00* (2006.01)

(52) U.S. Cl.
USPC ........... 257/698; 257/686; 257/693; 257/781; 257/E25.006; 257/E25.013

(58) Field of Classification Search
USPC .................. 257/635, 663, 698, 788
See application file for complete search history.

(56) References Cited

U.S. PATENT DOCUMENTS

| | | | |
|---|---|---|---|
| 6,337,510 B1 * | 1/2002 | Chun-Jen et al. | 257/666 |
| 7,279,784 B2 | 10/2007 | Liu | |
| 7,656,032 B2 | 2/2010 | Kariya et al. | |
| 7,709,935 B2 | 5/2010 | Islam et al. | |
| 8,232,658 B2 * | 7/2012 | Chow et al. | 257/790 |
| 2002/0053728 A1 * | 5/2002 | Isaak et al. | 257/686 |
| 2003/0038359 A1 * | 2/2003 | Fujimoto et al. | 257/688 |
| 2003/0042581 A1 * | 3/2003 | Fee et al. | 257/666 |
| 2007/0111374 A1 * | 5/2007 | Islam et al. | 438/106 |
| 2007/0145563 A1 * | 6/2007 | Punzalan et al. | 257/686 |
| 2010/0279466 A1 * | 11/2010 | Corisis et al. | 438/108 |

* cited by examiner

*Primary Examiner* — Calvin Lee
*Assistant Examiner* — Abul Kalam
(74) *Attorney, Agent, or Firm* — Ishimaru & Associates LLP; I-Chang John Yang

(57) ABSTRACT

A method of manufacture of an integrated circuit packaging system includes: forming a post of multiple plating layers having a base end with an inward protrusion, a connect riser, and a top end opposite the base end; positioning an integrated circuit device having a perimeter end facing the connect riser and the inward protrusion; attaching a bond wire directly on the inward protrusion and the integrated circuit device; and applying an encapsulation over the integrated circuit device, the bond wire, the inward protrusion, and around the post, the encapsulation exposing a portion of the base end and the top end of the post.

5 Claims, 12 Drawing Sheets

INTEGRATED CIRCUIT PACKAGING SYSTEM WITH INTERCONNECTS AND METHOD OF MANUFACTURE THEREOF

TECHNICAL FIELD

The present invention relates generally to an integrated circuit packaging system, and more particularly to a system with interconnects.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a post of multiple plating layers having a base end with an inward protrusion, a connect riser, and a top end opposite the base end; positioning an integrated circuit device having a perimeter end facing the connect riser and the inward protrusion; attaching a bond wire directly on the inward protrusion and the integrated circuit device; and applying an encapsulation over the integrated circuit device, the bond wire, the inward protrusion, and around the post, the encapsulation exposing a portion of the base end and the top end of the post.

The present invention provides an integrated circuit packaging system, including: a post formed of multiple plating layers having a base end with an inward protrusion, a connect riser, and a top end opposite the base end; an integrated circuit device having a perimeter end facing the connect riser and the inward protrusion; a bond wire directly on the inward protrusion and the integrated circuit device; and an encapsulation over the integrated circuit device, the bond wire, the inward protrusion, and around the post, a portion of the base end and the top end of the post exposed from the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
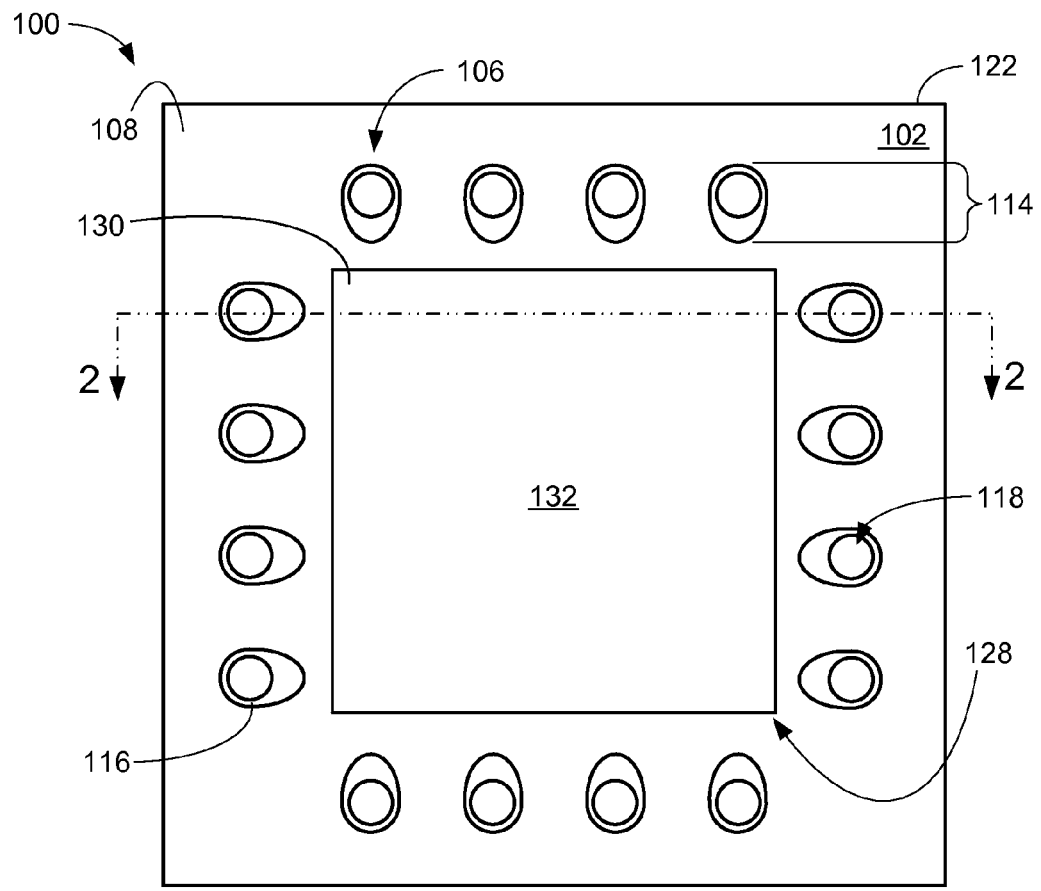
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The integrated circuit packaging system 100 is shown having an encapsulation 102 with one or more posts 106 partially exposed from a base surface 108 of the encapsulation 102.

The encapsulation 102 is a covering used to protect and hermetically seal the contents of the integrated circuit packaging system 100. The posts 106 can be formed from at least one plated layer of an electrically conductive material or from multiple plated layers of the electrically conductive material formed directly on one another. The electrically conductive material can include nickel, nickel palladium, an electrically conductive homogenous material having characteristics similar to nickel or nickel palladium, or a combination thereof.

The posts 106 can be used to provide electrical connectivity between the integrated circuit packaging system 100 and a next integration level (not shown). The next integration level can include another of the integrated circuit packaging system 100, a package containing circuitry, a printed circuit board, an electronic component, or any combination thereof.

The posts 106 include a base end 114 with a base flange 116 formed integrally with the base end 114 of the posts 106. The base end 114 is exposed from the base surface 108. The base end 114 can be coplanar with the base surface 108 or coplanar with one another.

The base end 114 is shown having an outlined shape of an ellipse. It is understood that the base end 114 can have a different outlined shape. For example, the base end 114 can have an outlined shape of a circle, a square, a triangle, or of any polygon.

A through hole 118 can optionally be formed in the posts 106. The through hole 118 can be perpendicular to the base surface 108. Any portion of the posts 106, including the base end 114 or an interior of the posts 106 forming the through hole 118, can be used to provide electrical connectivity with the integrated circuit packaging system 100.

For purposes of illustration, the through hole 118 of the posts 106 is shown having an outlined shape of a circle with a center of the circle offset from a center of the base end 114. The through hole 118 can have any outlined shape within the outlined shape of the base end 114. For example, the through hole 118 could have an outlined shape of an ellipse with a center at the center of the base end 114.

The posts 106 can be formed directly between peripheral sides 122 of the encapsulation 102 and a component region 128 formed in the encapsulation 102. The component region 128 is defined a region within the integrated circuit packaging system 100 having integrated circuit components.

For purposes of illustration, the present embodiment is shown having the component region 128. The present embodiment can have more than one component region similar to the component region 128. For example, there could be a first component region and a second component region, each having different sizes or shapes and each adjacent the posts 106.

The component region 128 is exposed from the base surface 108 of the encapsulation 102. Between eighty and ninety-five percent of the component region 128 is exposed from the base surface 108 of the encapsulation 102.

The component region 128 can include an exposed side 130 of an attachment material 132 exposed within a perimeter of the component region 128. The attachment material 132 can be partially cured, fully cured, pliable, or hardened. The attachment material and can include an adhesive, an adhesive layer, an adhesive film, and adhesive tape, or any combination thereof.

Figure 2:
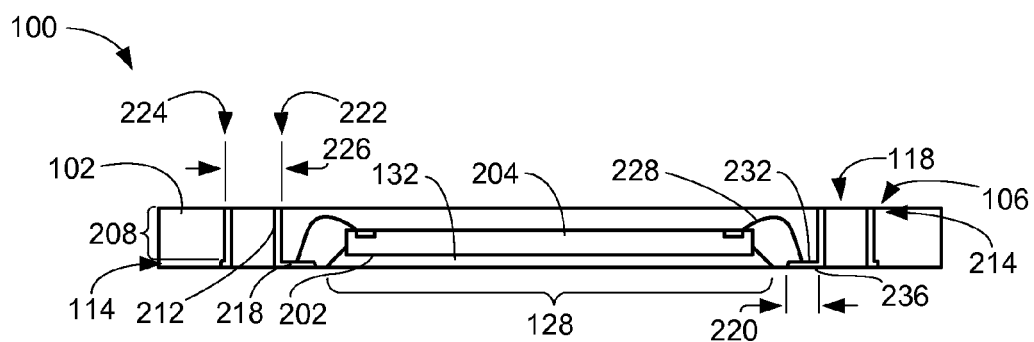
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. The exposed side 130 of FIG. 1 can be coplanar with the base surface 108 of FIG. 1. An inactive side 202 of an integrated circuit device 204 can be attached directly to a device side of the attachment material 132 facing away from and opposite the exposed side 130. The integrated circuit device 204 can include a wire bond chip, an integrated circuit module, an electronic device, or any combination thereof.

The inactive side 202 is opposite the active side of the integrated circuit device 204 having active circuitry fabricated thereon or having elements for connection to the active circuitry within the integrated circuit device 204. Each of the posts 106 can include a connect riser 208.

The connect riser 208 is formed as an integral part of the base end 114 using one or more multiple plated layers of the electrically conductive material. The connect riser 208 can include interior riser sides 212 to form the through hole 118 of the posts 106. The through hole 118 can extend from the base end 114, through the posts 106, and out of a top end 214 of the posts 106 opposite the base end 114.

An inward protrusion 218 of the base flange 116 of FIG. 1 extends away from the posts 106 towards a perimeter end of the integrated circuit device 204 in a direction perpendicular to one of the peripheral sides 122 of FIG. 1 that is closest to the inward protrusion 218.

A connect length 220 is defined as a length from a first end of the inward protrusion 218 intersecting a side of the posts 106 to a second end of the inward protrusion 218 opposite and facing away from the first end. The connect length 220 is a measurement from a line perpendicular with one of the peripheral sides 122 and intersecting the first end and the second end of the inward protrusion 218.

A first plane 222 is defined as being tangent to a first surface portion of the connect riser 208 directly facing the integrated circuit device 204 and parallel with one of the peripheral sides 122. A second plane 224 is defined as being tangent to a second surface portion of the connect riser 208 facing away from the integrated circuit device 204 and parallel with the first plane 222. An enclosed post width 226 is defined as a distance between the first plane 222 and the second plane 224 measured perpendicularly from the first plane 222. The inward protrusion 218 of any one of the posts 106 can be pre-determined and formed to have the connect length 220 less than the enclosed post width 226 and greater than one-half the enclosed post width 226.

Bond wires 228 can be directly attached to circuitry of the integrated circuit device 204 and directly on a connect side 232 of the inward protrusion 218. The bond wires 228 can provide electrical connectivity between the posts 106 and the integrated circuit device 204.

The encapsulation 102 surrounds the posts 106 and covers the connect side 232, the integrated circuit device 204, the bond wires 228, and a portion of the attachment material 132. A contact side 236 of the inward protrusion 218 opposite and facing away from the connect side 232 is exposed from the encapsulation 102 and the top end 214 of the posts 106 opposite the base end 114 is exposed from the encapsulation 102.

It has been discovered that the posts 106 with the connect length 220 pre-determined and formed to have the connect length 220 greater than one-half the enclosed post width 226 provides the posts 106 with superior pull-out resistance thereby improving reliability.

It has further been discovered that the posts 106 with the connect length 220 pre-determined and formed to have the connect length 220 less than the enclosed post width 226 and greater than one-half the enclosed post width 226 results in a package with interconnects optimized for a minimum footprint and a maximum number of inputs or outputs.

It has yet further been discovered that the attachment material 132 exposed from the encapsulation 102 provides additional isolation between the integrated circuit device 204 and the next integration level.

It has yet further been discovered that the integrated circuit packaging system 100 can be mounted or attached directly on to a next integration level using the exposed side 130 of the attachment material 132.

It has yet further been discovered that the posts 106 having the base flange 116 with the contact side 236 exposed provides additional connective surface areas for testing resulting in substantial shipped product quality by reducing and elimination of defect escapes.

It has yet further been discovered that integrally forming of the posts 106 using plated layers provides smaller sized, thinner, or finer pitched interconnects over interconnects formed using etched processes.

It has yet further been discovered that the base flange 116 with the inward protrusion 218 results in minimized wiring lengths between the posts 106 and the integrated circuit device 204 to provide improved signal performance characteristics.

Figure 3:
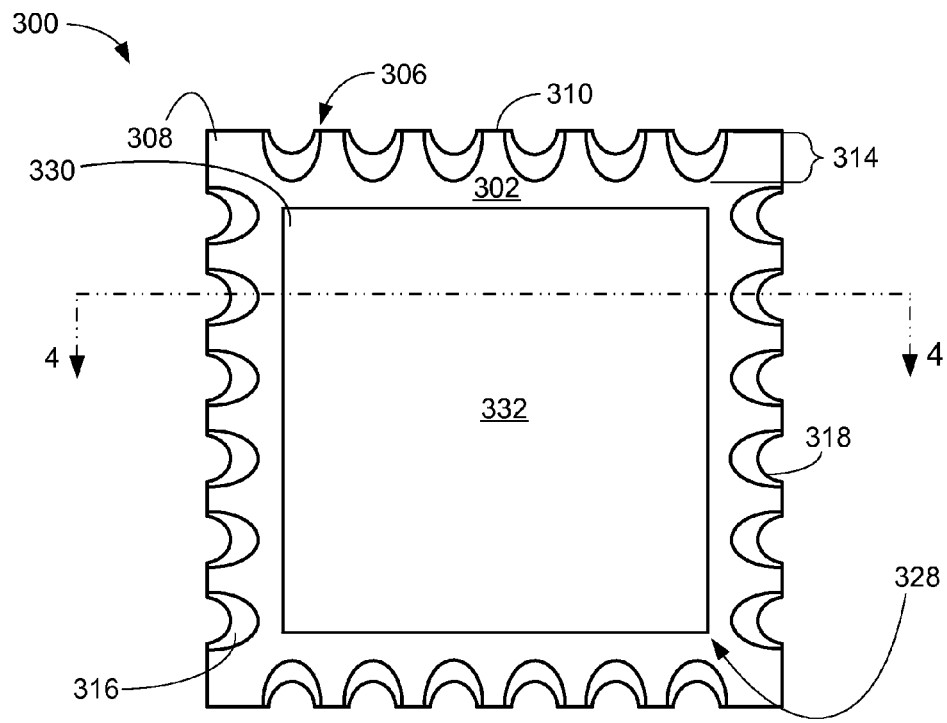
FIG. 3 is a bottom view of an integrated circuit packaging system in a second embodiment of the present invention.

Referring now to FIG. 3, therein is shown a bottom view of an integrated circuit packaging system 300 in a second embodiment of the present invention. The integrated circuit packaging system 300 is shown having an encapsulation 302 with one or more posts 306 partially exposed from a base surface 308 of the encapsulation 302 and peripheral sides 310 of the encapsulation 302.

The encapsulation 302 is a covering used to protect and hermetically seal the contents of the integrated circuit packaging system 300. The posts 306 can be formed from at least one plated layer of an electrically conductive material or from multiple plated layers of the electrically conductive material formed directly on one another. The electrically conductive material can include nickel, nickel palladium, an electrically conductive homogenous material having characteristics similar to nickel or nickel palladium, or a combination thereof.

The posts 306 can be used to provide electrical connectivity between the integrated circuit packaging system 300 and a next integration level (not shown). The next integration level can include another of the integrated circuit packaging system 300, a package containing circuitry, a printed circuit board, an electronic component, or any combination thereof.

The posts 306 include a base end 314 with a base flange 316 formed integrally with the base end 314 of the posts 306. The base end 314 is exposed from the base surface 308. The base end 314 can be coplanar with the base surface 308 or coplanar with one another.

The base end 314 is shown having an outlined shape of a crescent. It is understood that the base end 314 can have a different outlined shape. For example, the base end 314 can have an outlined shape of a circle, a square, a triangle, or of any polygon.

A concave side 318 can optionally be formed in the posts 306. The concave side 318 can be perpendicular to the base surface 308. Any portion of the posts 306, including the base end 314 or an interior of the posts 306 forming the concave side 318, can be used to provide electrical connectivity with the integrated circuit packaging system 300.

For purposes of illustration, the concave side 318 of the posts 306 is shown having an outlined shape of a circle with a center of the circle offset from a center of the base end 314. The concave side 318 can have any outlined shape within the outlined shape of the base end 314. For example, the concave side 318 could have an outlined shape of an ellipse with a center at the center of the base end 314.

The posts 306 can be formed directly between the peripheral sides 310 of the encapsulation 302 and a component region 328 formed in the encapsulation 302. The component region 328 is defined a region within the integrated circuit packaging system 300 having integrated circuit components.

For purposes of illustration, the present embodiment is shown having the component region 328. The present embodiment can have more than one component region similar to the component region 328. For example, there could be a first component region and a second component region, each having different sizes or shapes and each adjacent the posts 306.

The component region 328 is exposed from the base surface 308 of the encapsulation 302. Between eighty and ninety-five percent of the component region 328 is exposed from the base surface 308 of the encapsulation 302.

The component region 328 can include an exposed side 330 of an attachment material 332 exposed within a perimeter of the component region 328. The attachment material 332 can be partially cured, fully cured, pliable, or hardened. The attachment material and can include an adhesive, an adhesive layer, an adhesive film, and adhesive tape, or any combination thereof.

Figure 4:
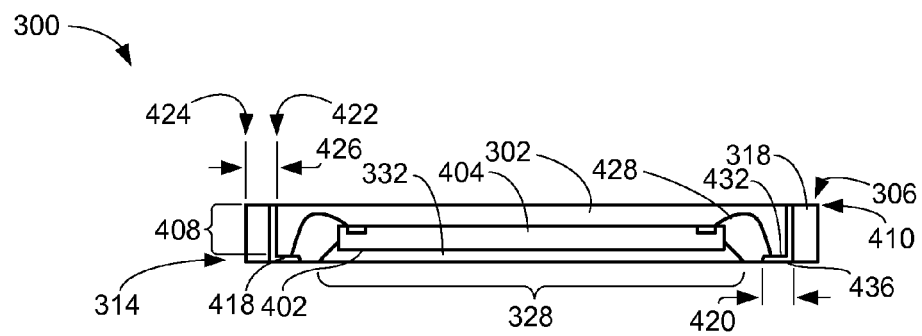
FIG. 4 is a cross-sectional view of FIG. 3 taken along a line 4-4 of FIG. 3.

Referring now to FIG. 4, therein is shown a cross-sectional view of FIG. 3 taken along a line 4-4 of FIG. 3. The exposed side 330 of FIG. 3 can be coplanar with the base surface 308 of FIG. 3. An inactive side 402 of an integrated circuit device 404 can be attached directly to a device side of the attachment material 332 facing away from and opposite the exposed side 330. The integrated circuit device 404 can include a wire bond chip, an integrated circuit module, an electronic device, or any combination thereof.

The inactive side 402 is opposite the active side of the integrated circuit device 404 having active circuitry fabricated thereon or having elements for connection to the active circuitry within the integrated circuit device 404. Each of the posts 306 can include a connect riser 408.

The connect riser 408 is formed as an integral part of the base end 314 using one or more multiple plated layers of the electrically conductive material. The concave side 318 is formed in the connect riser 408 extending and exposed from the base end 314 to a top end 410 of the posts 306 opposite the base end 314.

An inward protrusion 418 of the base flange 316 of FIG. 3 extends away from the posts 306 towards a perimeter end of the integrated circuit device 404 in a direction perpendicular to one of the peripheral sides 310 of FIG. 3 that is closest to the inward protrusion 418.

A connect length 420 is defined as a length from a first end of the inward protrusion 418 intersecting a side of the posts 306 to a second end of the inward protrusion 418 opposite and facing away from the first end. The connect length 420 is a measurement from a line perpendicular with one of the peripheral sides 310 and intersecting the first end and the second end of the inward protrusion 418.

A first plane 422 is defined as being tangent to a first surface portion of the connect riser 408 directly facing the integrated circuit device 404 and parallel with one of the peripheral sides 310. A second plane 424 is defined as being tangent to ends of the connect riser 408 facing away from the integrated circuit device 404 and parallel with the first plane 422. An open post width 426 is defined as a distance between the first plane 422 and the second plane 424 measured perpendicularly from the first plane 422. The inward protrusion 418 of any one of the posts 306 can be pre-determined and formed to have the connect length 420 less than the open post width 426 and greater than one-half the open post width 426.

Bond wires 428 can be directly attached to circuitry of the integrated circuit device 404 and directly on a connect side 432 of the inward protrusion 418. The bond wires 428 can provide electrical connectivity between the posts 306 and the integrated circuit device 404.

The encapsulation 302 surrounds the posts 306 and covers the connect side 432, the integrated circuit device 404, the bond wires 428, and a portion of the attachment material 332. A contact side 436 of the inward protrusion 418 opposite and facing away from the connect side 432 is exposed from the encapsulation 302 and the top end 410 of the posts 306 over the base end 314 is exposed from the encapsulation 302.

It has been discovered that the posts 306 with the connect length 420 pre-determined and formed to have the connect length 420 greater than one-half the open post width 426 provides the posts 306 with superior pull-out resistance.

It has been discovered that the posts 306 with the connect length 420 pre-determined and formed to have the connect length 420 less than the open post width 426 and greater than one-half the open post width 426 results in a package with interconnects optimized for a minimum footprint and a maximum number of inputs or outputs.

It has been discovered that the attachment material 332 exposed from the encapsulation 302 provides additional isolation between the integrated circuit device 404 and the next integration level.

It has been discovered that the integrated circuit packaging system 300 can be mounted or attached directly on to a next integration level using the exposed side 330 of the attachment material 332.

It has been discovered that the posts 306 having the base flange 316 with the contact side 436 exposed provides additional connective surface areas for testing resulting in substantial shipped product quality by reducing and elimination of defect escapes.

It has been discovered that integrally forming of the posts 306 using plated layers provides smaller sized, thinner, or finer pitched interconnects over interconnects formed using etched processes.

It has been discovered that the base flange 316 with the inward protrusion 418 results in minimized wiring lengths between the posts 306 and the integrated circuit device 404 to provide improved signal performance characteristics.

Figure 5:
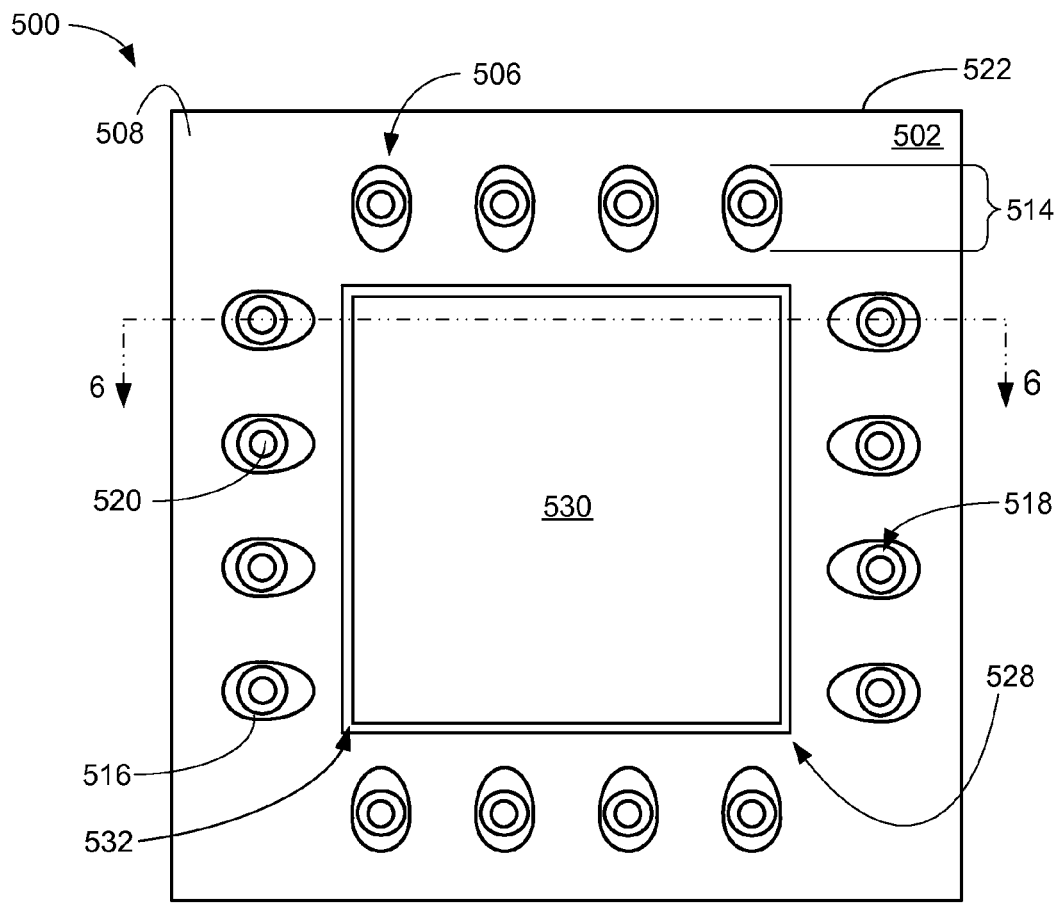
FIG. 5 is a bottom view of an integrated circuit packaging system in a third embodiment of the present invention.

Referring now to FIG. 5, therein is shown a bottom view of an integrated circuit packaging system 500 in a third embodiment of the present invention. The integrated circuit packaging system 500 is shown having an encapsulation 502 with one or more posts 506 partially exposed from a base surface 508 of the encapsulation 502.

The encapsulation 502 is a covering used to protect and hermetically seal the contents of the integrated circuit packaging system 500. The posts 506 can be formed from at least one plated layer of an electrically conductive material or from multiple plated layers of the electrically conductive material formed directly on one another. The electrically conductive material can be a pre-plating that can include nickel, nickel palladium, an electrically conductive homogenous material having characteristics similar to nickel or nickel palladium, or a combination thereof.

The posts 506 can be used to provide electrical connectivity between the integrated circuit packaging system 500 and a next integration level (not shown). The next integration level can include another of the integrated circuit packaging system 500, a package containing circuitry, a printed circuit board, an electronic component, or any combination thereof.

The posts 506 include a base end 514 with a base flange 516 formed integrally with the base end 514 of the posts 506. The base end 514 is exposed from the base surface 508. The base end 514 can be coplanar with the base surface 508 or coplanar with one another.

The base end 514 is shown having an outlined shape of an ellipse. It is understood that the base end 514 can have a different outlined shape. For example, the base end 514 can have an outlined shape of a circle, a square, a triangle, or of any polygon.

A conductive protrusion 518 can optionally be formed in the posts 506. The conductive protrusion 518 can extend above the posts 506 and can be formed of copper or a copper alloy. The conductive protrusion 518 can be a lead standoff for the integrated circuit packaging system 500. An end of the conductive protrusion 518 can be covered with a standoff contact 520.

The standoff contact 520 can be formed from the electrically conductive material of the posts 506 and in a manner similar to the posts 506. The standoff contact 520 is separated from the posts 506 by the conductive protrusion 518 between the standoff contact 520 and the posts 506. The standoff contact 520, the conductive protrusion 518 or any portion of the posts 506, can be used to provide electrical connectivity with the integrated circuit packaging system 500.

For purposes of illustration, the conductive protrusion 518 of the posts 506 is shown having an outlined shape of a circle with a center of the circle offset from a center of the base end 514. The conductive protrusion 518 can have any outlined shape within the outlined shape of the base end 514. For example, the conductive protrusion 518 could have an outlined shape of an ellipse with a center at the center of the base end 514.

Also, for purposes of illustration, the standoff contact 520 is shown having an outlined shape of a circle. The standoff contact 520 can have any outlined shape with an area less than an area formed by any plane intersecting sides of the conductive protrusion 518 and parallel with the base surface 508. For example, the standoff contact 520 can have an outlined shape of a square having an area less than an area formed by any plane intersecting the sides of the conductive protrusion 518 and parallel with the base surface 508.

The posts 506 can be formed directly between peripheral sides 522 of the encapsulation 502 and a component region 528 formed in the encapsulation 502. The component region 528 is defined a region within the integrated circuit packaging system 500 having integrated circuit components.

Further, for purposes of illustration, the present embodiment is shown having the component region 528. The present embodiment can have more than one component region similar to the component region 528. For example, there could be a first component region and a second component region, each having different sizes or shapes and each adjacent the posts 506.

The component region 528 is exposed from the base surface 508 of the encapsulation 502. Between eighty and ninety-five percent of the component region 528 is exposed from the base surface 508 of the encapsulation 502.

The component region 528 can include a component contact 530 formed from the electrically conductive material of the posts 506, in a manner similar to the posts 506, and exposed within a perimeter of the component region 528. The component contact 530 can be attached on to a component protrusion and coplanar with the standoff contact 520.

A component protrusion 532 fills the component region 528 and extends above the base surface 508. The component protrusion 532 can be formed from the material of the conductive protrusion 518.

Figure 6:
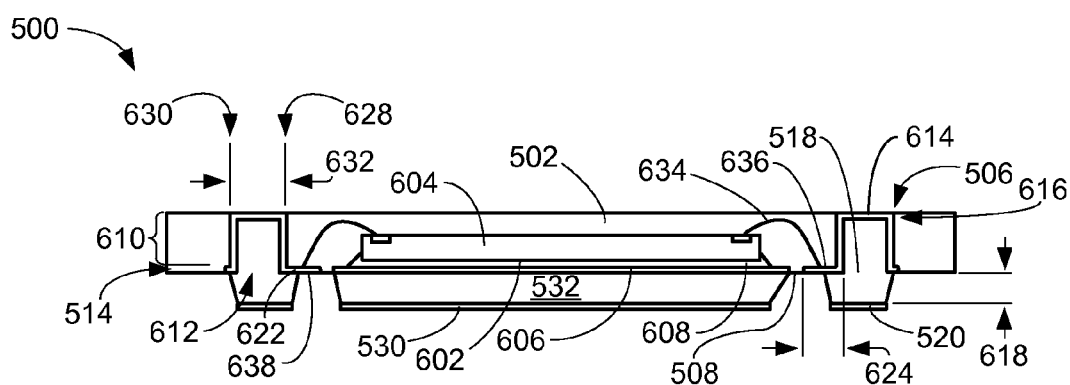
FIG. 6 is a cross-sectional view of FIG. 5 taken along a line 6-6 of FIG. 5.

Referring now to FIG. 6, therein is shown a cross-sectional view of FIG. 5 taken along a line 6-6 of FIG. 5. An inactive side 602 of an integrated circuit device 604 can be attached to a component panel 606 using a mount material 608 similar to the attachment material 132 of FIG. 1. The mount material 608 can have an area that is between ninety and seventy-five percent smaller than an area of the component panel 606.

The integrated circuit device 604 can include a wire bond chip, an integrated circuit module, an electronic device, or any combination thereof. The inactive side 602 is opposite the active side of the integrated circuit device 604 having active circuitry fabricated thereon or having elements for connection to the active circuitry within the integrated circuit device 604.

The component panel 606 can be formed in a manner similar to the base end 514 using the electrically conductive material of the posts 506. The component panel 606 can be formed on a side of the component protrusion 532 opposite a side of the component protrusion 532 having the component contact 530.

The component contact 530 can be formed having an area that is between seventy-five and eighty-five percent smaller than an area of the component panel 606. The sides of the component protrusion 532 form an obtuse angle with respect to the base surface 508 and are tapered.

Each of the posts 506 can include a connect riser 610. The connect riser 610 is formed as an integral part of the base end 514 using one or more multiple plated layers of the electrically conductive material. The connect riser 610 can be formed having a cavity 612 through the base end 514, extending into the connect riser 610, and exposing a sealed side 614 at a top end 616 of the connect riser 610 opposite the base end 514.

The conductive protrusion 518 is formed in the cavity 612 of the connect riser 610 and extends from the sealed side 614 exposed in the cavity to a standoff height 618 over the base flange 516 exposed from the encapsulation 502. The standoff height 618 is defined as a distance measured perpendicularly from the base surface 508 to the end of the conductive protrusion 518 having the standoff contact 520.

The conductive protrusion 518 can be perpendicular to the base surface 508. Sides of the conductive protrusion 518 exposed above the base surface 508 can be tapered to form an obtuse angle with respect to the base surface 508. An inward protrusion 622 of the base flange 516 of FIG. 5 extends away from the posts 506 towards a perimeter end of the integrated circuit device 604 in a direction perpendicular to one of the peripheral sides 522 of FIG. 5 that is closest to the inward protrusion 622.

A connect length 624 is defined as a length from a first end of the inward protrusion 622 intersecting a side of the posts 506 to a second end of the inward protrusion 622 opposite and facing away from the first end. The connect length 624 is a measurement on a line perpendicular with one of the peripheral sides 522 and intersecting a midpoint of the first end and a midpoint of the second end of the inward protrusion 622.

A first plane 628 is defined as being tangent to a first surface portion of the connect riser 610 directly facing the integrated circuit device 604 and parallel with one of the peripheral sides 522. A second plane 630 is defined as being tangent to a second surface portion of the connect riser 610 facing away from the integrated circuit device 604 and parallel with the first plane 628.

An enclosed post width 632 is defined as a distance between the first plane 628 and the second plane 630, measured perpendicularly from the first plane 628.

The inward protrusion 622 of any one of the posts 506 can be pre-determined and formed to have the connect length 624 less than the enclosed post width 632 and greater than one-half the enclosed post width 632. A width measured between opposing sides of the conductive protrusion 518 exposed above the base surface 508 can be greater than the enclosed post width 632. The standoff contact 520 can have a width greater than the enclosed post width 632 and greater than a resultant of a summation of the enclosed post width 632 and the connect length 624.

Bond wires 634 can be directly attached to circuitry of the integrated circuit device 604 and directly on a connect side 636 of the inward protrusion 622. The bond wires 634 can provide electrical connectivity between the posts 506 and the integrated circuit device 604. A contact side 638 of the inward protrusion 622 opposite and facing away from the connect side 636 is partially exposed from the encapsulation 502.

The encapsulation 502 surrounds the posts 506 and covers the connect side 636, the integrated circuit device 604, the bond wires 634, a portion of the attachment material 332, and the component panel 606. The contact side 638, the component protrusion 532, the component contact 530, the standoff contact 520, and a portion of the conductive protrusion 518 extending from the base end 514 are exposed from the encapsulation 502. The sealed side 614 at the top end 616 of the posts 506 opposite the base end is exposed from the encapsulation 502.

It has been discovered that the posts 506 with the connect length 624 pre-determined and formed to have the connect length 624 greater than one-half the enclosed post width 632 provides the posts 506 with superior pull-out resistance.

It has further been discovered that the posts 506 with the connect length 624 pre-determined and formed to have the connect length 624 less than the enclosed post width 632 and greater than one-half the enclosed post width 632 results in a package with interconnects optimized for a minimum footprint and a maximum number of inputs or outputs.

It has yet further been discovered that the posts 506 having the base flange 516 with the contact side 638 exposed provides additional connective surface areas for testing resulting in substantial shipped product quality by reducing and elimination of defect escapes.

It has yet further been discovered that integrally forming of the posts 506 using plated layers provides smaller sized, thinner, or finer pitched interconnects over interconnects formed using etched processes.

It has yet further been discovered that the base flange 516 with the inward protrusion 622 results in minimized wiring lengths between the posts 506 and the integrated circuit device 604 to provide improved signal performance characteristics.

Figure 7:
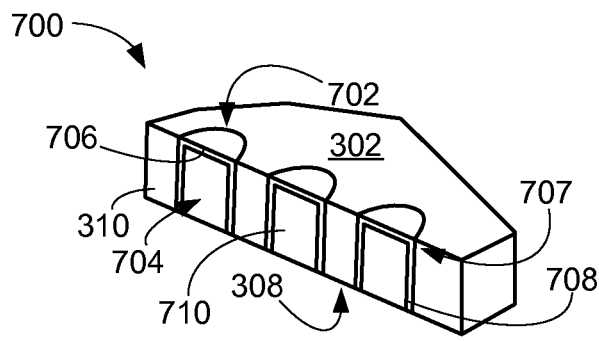
FIG. 7 is a detailed portion of an isometric view of an integrated circuit packaging system in a fourth embodiment of the present invention.

Referring now to FIG. 7, therein is shown a detailed portion of an isometric view of an integrated circuit packaging system 700 in a fourth embodiment of the present invention. The integrated circuit packaging system 700 can be similar to the integrated circuit packaging system 300 of FIG. 4 except the integrated circuit packaging system 700 can include posts 702 and a conductive solid 704 formed from a copper or copper alloy.

The posts 702 are similar to the posts 306 of FIG. 4 except each of the posts 702 can include a sealed side 706 integral with a top end 707 of the posts 702 in a manner similar to the sealed side 614 of FIG. 6, the top end 616 of FIG. 6, and the posts 506 of FIG. 5, respectively. The sealed side 706 can be exposed from and coplanar with a surface of the encapsulation 302 opposite and facing away from the base surface 308 of the encapsulation 302.

The posts 702 can be formed from at least one plated layer of the electrically conductive material or from multiple plated layers of the electrically conductive material formed directly on one another. A concave side 708 of the posts 702 similar to the concave side 318 of FIG. 3 can contain the conductive solid 704. A flat side 710 of the posts 702 formed by the conductive solid 704 can fill an inner the concave side 708 and the sealed side 706 facing the base surface 308. The flat side 710 can be exposed and coplanar with one of the peripheral sides 310 of the encapsulation 302.

Figure 8:
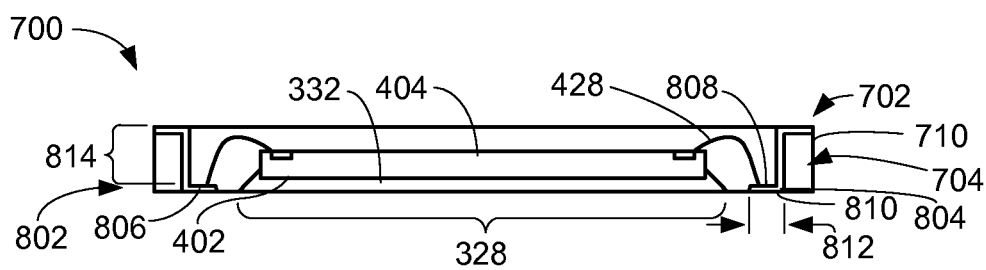
FIG. 8 is a cross-sectional view of the integrated circuit packaging system of FIG. 7.

Referring now to FIG. 8, therein is shown a cross-sectional view of the integrated circuit packaging system 700 of FIG. 7. The posts 702 include base end 802 with a base flange 804 and an inward protrusion 806 in a manner similar to the base end 314 of FIG. 3 with the base flange 316 of FIG. 3 and the inward protrusion 418 of FIG. 4, respectively.

The inward protrusion 806 includes a connect side 808, a contact side 810, and a connect length 812, in a manner similar to the inward protrusion 418 of FIG. 4, the connect side 432 of FIG. 4, the contact side 436 of FIG. 4, and the connect length 420 of FIG. 4, respectively. A base side of the conductive solid 704 and the base flange 804 can be exposed and coplanar with the base surface 308 of FIG. 7.

The posts 702 includes a connect riser 814 integral with the base end 802 in a manner similar to the posts 306, the connect riser 408 of FIG. 4, and the base end 314, respectively. The flat side 710 extends from the top end 707 of FIG. 7 to the base end 802.

The inactive side 402 of the integrated circuit device 404 is shown directly attached to the attachment material 332 within the component region 328. The bond wires 428 is attached directly to the integrated circuit device 404 and directly on the connect side 808 of the posts 702 to provide electrical connectivity between the posts 702 and the integrated circuit device 404.

Figure 9:
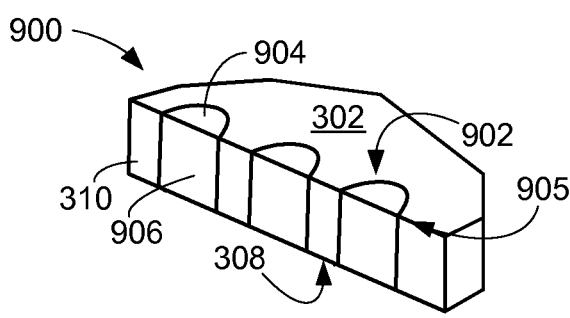
FIG. 9 is a detailed portion of an isometric view of an integrated circuit packaging system in a fifth embodiment of the present invention.

Referring now to FIG. 9, therein is shown a detailed portion of an isometric view of an integrated circuit packaging system 900 in a fifth embodiment of the present invention. The integrated circuit packaging system 900 can be similar to the integrated circuit packaging system 300 of FIG. 4 except the integrated circuit packaging system 900 can include posts 902 formed entirely from an electrically conductive etch-resistant material that can include nickel or a metal having properties similar to nickel.

A flat end 904 at a top end 905 of the posts 902 can be exposed from and coplanar with a surface of the encapsulation 302 opposite and facing away from the base surface 308 of the encapsulation 302. The posts 902 can be formed or built-up from at least one plated layer of the electrically conductive etch-resistant material or from multiple plated layers of the electrically conductive etch-resistant material formed directly on one another.

A flat side 906 of the posts 902 can be exposed and coplanar with one of the peripheral sides 310 of the encapsulation 302. Any portion of the posts 902, including the flat end 904 and the side of the posts 902 exposed from the encapsulation 302, can be used to provide electrical connectivity with the integrated circuit packaging system 900.

Figure 10:
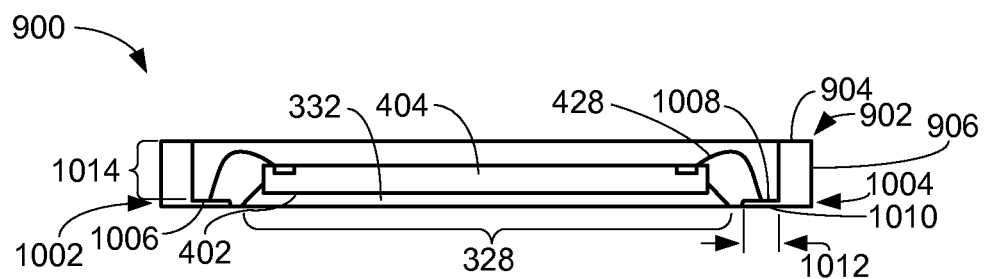
FIG. 10 is a cross-sectional view of the integrated circuit packaging system of FIG. 9.

Referring now to FIG. 10, therein is shown a cross-sectional view of the integrated circuit packaging system 900 of FIG. 9. The posts 902 include base end 1002 with a base flange 1004 and an inward protrusion 1006 in a manner similar to the base end 314 of FIG. 3 with the base flange 316 of FIG. 3 and the inward protrusion 418 of FIG. 4, respectively. The flat side 906 extends from the top end 905 of FIG. 9 to the base end 1002 and can be integral with the flat end 904.

The inward protrusion 1006 includes a connect side 1008, a contact side 1010, and a connect length 1012, in a manner similar to the inward protrusion 418 of FIG. 4, the connect side 432 of FIG. 4, the contact side 436 of FIG. 4, and the connect length 420 of FIG. 4, respectively. The inactive side 402 of the integrated circuit device 404 is shown directly attached to the attachment material 332 within the component region 328.

The bond wires 428 is attached directly to the integrated circuit device 404 and directly on the connect side 1008 of the posts 902 to provide electrical connectivity between the posts 902 and the integrated circuit device 404. The posts 902 includes a connect riser 1014 integral with the base end 1002 in a manner similar to the connect riser 408 of FIG. 4.

Figure 11:
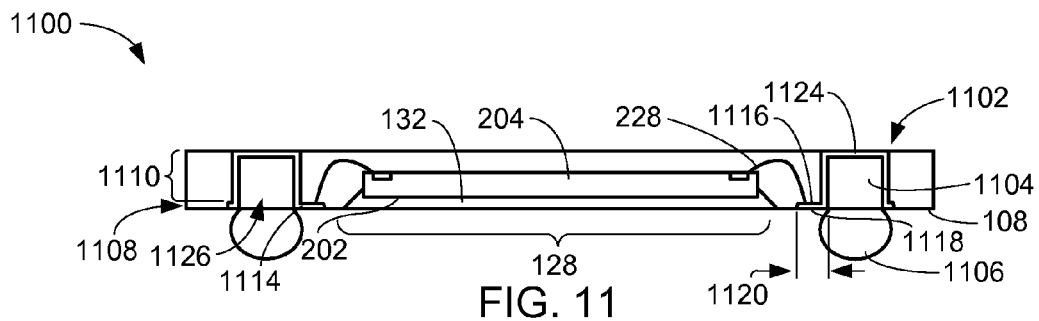
FIG. 11 is a cross-sectional view of an integrated circuit packaging system in a sixth embodiment of the present invention.

Referring now to FIG. 11, therein is shown a cross-sectional view of an integrated circuit packaging system 1100 in a sixth embodiment of the present invention. The integrated circuit packaging system 1100 can be similar to the integrated circuit packaging system 100 of FIG. 2 except the integrated circuit packaging system 1100 can include posts 1102, a conductive solid 1104, and a system connector 1106 such as a solder, solder ball, or solder bump.

The posts 1102 can be formed from at least one plated layer of the electrically conductive material or from multiple plated layers of the electrically conductive material formed directly on one another. The posts 1102 can include a base end 1108 and a connect riser 1110 in a manner similar to the posts 506 of FIG. 6, the base end 514 of FIG. 6, and the connect riser 610 of FIG. 6, respectively. The base end 1108 can include an inward protrusion 1114 in a manner similar to the base end 514 and the inward protrusion 622 of FIG. 6, respectively.

The inward protrusion 1114 can include a connect side 1116, a contact side 1118, and a connect length 1120 in a matter similar to the inward protrusion 622, the connect side 636 of FIG. 6, the contact side 638 of FIG. 6, and the connect length 624 of FIG. 6, respectively. The posts 1102 also include a sealed side 1124 in a manner similar to the posts 506 and the sealed side 614 of FIG. 6, respectively.

A cavity 1126 can be formed in the posts 1102 in a manner similar to the cavity 612 of FIG. 6 in the posts 506, respectively. The cavity 1126 can contain the conductive solid 1104 formed from a copper or copper alloy.

The system connector 1106 can be attached directly on a side of the conductive solid 1104 exposed from the base surface 108 to provide connectivity between the integrated circuit packaging system 1100 and the next integration level. The side of the conductive solid 1104 exposed from the base surface 108 can be coplanar with the base surface 108.

The inactive side 202 of the integrated circuit device 204 is shown directly attached to the attachment material 132 within the component region 128. The bond wires 228 is attached directly to the integrated circuit device 204 and directly on the connect side 1116 of the posts 1102 to provide electrical connectivity between the posts 1102 and the integrated circuit device 204.

Figure 12:
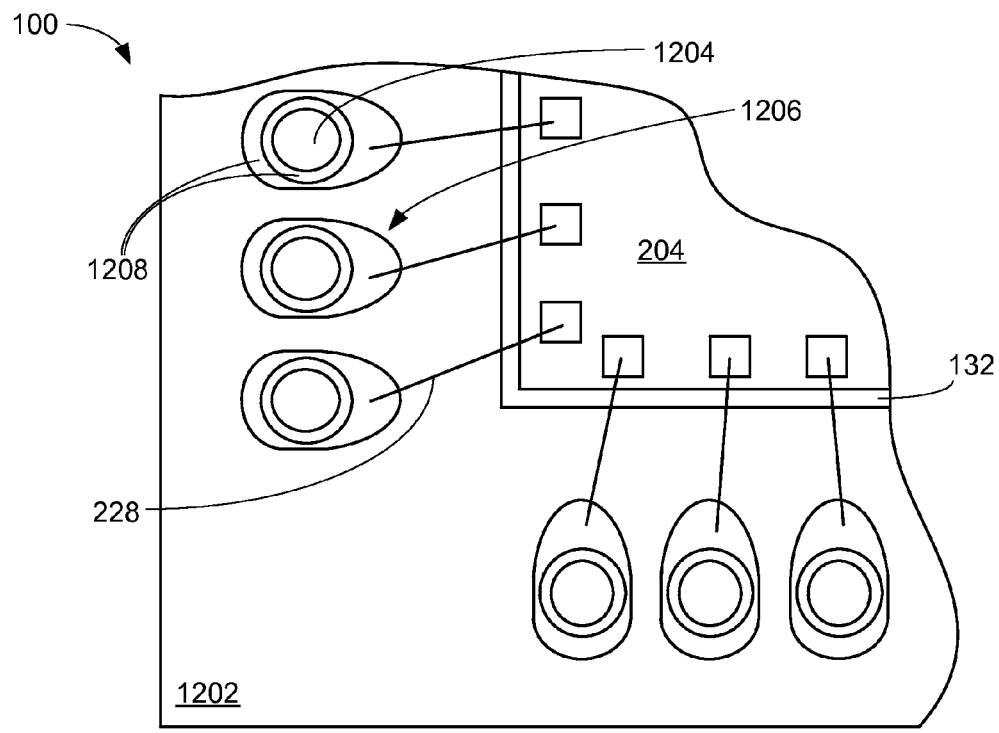
FIG. 12 is a portion of a top view of the integrated circuit packaging system of FIG. 2 in a connecting phase of manufacturing.

Referring now to FIG. 12, therein is shown a portion of a top view of the integrated circuit packaging system 100 of FIG. 2 in a connecting phase of manufacturing. Shown is an enlarged view of a portion of a panel 1202 formed from an etchable material that can include a copper or a copper alloy. The panel 1202 can include non-horizontal cylindrical protrusions 1204 formed of the etchable material and protruding from a component side of the panel 1202.

Non-horizontal sides of the non-horizontal cylindrical protrusions 1204 and base areas 1206 on the component side surrounding each of the non-horizontal cylindrical protrusions 1204 can be integrally covered with an electrically conductive layer 1208 that can include the electrically conductive material using any combination of a masking, a cleaning, or a plating process. The integrated circuit device 204 can be mounted over the panel 1202 and adjacent the non-horizontal cylindrical protrusions 1204 using the attachment material 132 in a mounting process.

The integrated circuit device 204 is attached directly on a primary side of the attachment material 132. A secondary side (not shown) of the attachment material 132 opposite the primary side can be attached directly on the component side. The bond wires 228 can be attached directly on a portion of the electrically conductive layer 1208 closest to the integrated circuit device 204 and directly to active circuitry of the integrated circuit device 204 using a bonding process.

Figure 13:
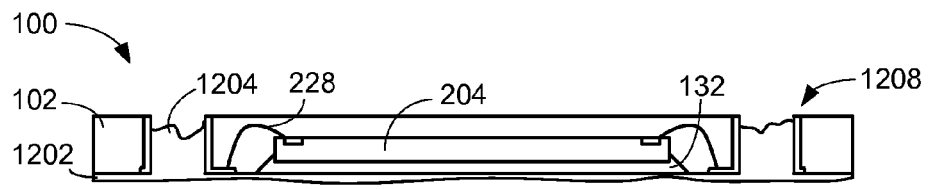
FIG. 13 is a cross-sectional view of FIG. 2 in a removal phase.

Referring now to FIG. 13, therein is shown a cross-sectional view of FIG. 2 in a removal phase. The bond wires 228, the integrated circuit device 204, portions of the attachment material 132, and the electrically conductive layer 1208 exposed over the component side of the panel 1202 can be covered with the encapsulation 102 using a molding process. An end of the non-horizontal cylindrical protrusions 1204 exposed from the electrically conductive layer 1208 is exposed from the encapsulation 102 during the molding process.

The panel 1202 and the non-horizontal cylindrical protrusions 1204 can be removed from the encapsulation 102, the attachment material 132, and the electrically conductive layer 1208 during the removal phase to form the integrated circuit packaging system 100 of FIG. 1 with the posts 106 of FIG. 1 formed having the through hole 118 of FIG. 1. The removal phase can include etching, grinding, drilling, copper stripetching, sanding, or equivalent removal processes. Copper can be etched away leaving from the electrically conductive layer 1208 and the integrated circuit packaging system 100.

Figure 14:
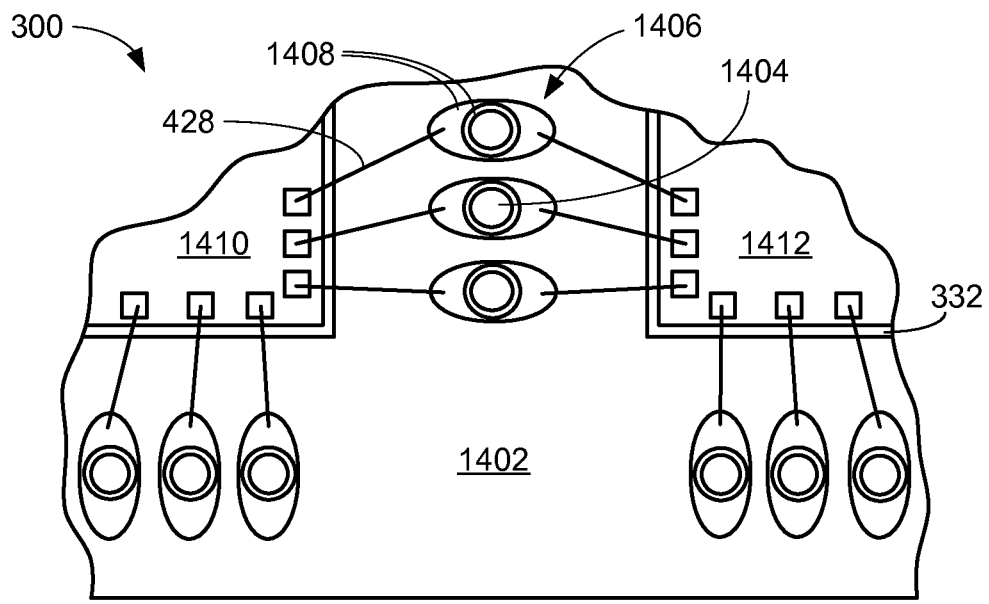
FIG. 14 is a portion of a top view of the integrated circuit packaging system of FIG. 3 in a connecting phase of manufacturing.

Referring now to FIG. 14, therein is shown a portion of a top view of the integrated circuit packaging system 300 of FIG. 3 in a connecting phase of manufacturing. Shown is an enlarged view of a portion of a panel 1402 formed from an etchable material that can include a copper or copper alloy. The panel 1402 can include non-horizontal cylindrical protrusions 1404 formed of the etchable material and protruding from a component side of the panel 1402.

Non-horizontal sides of the non-horizontal cylindrical protrusions 1404 and base areas 1406 on the component side surrounding each of the non-horizontal cylindrical protrusions 1404 can be integrally covered with an electrically conductive layer 1408 that can include the electrically conductive material using any combination of a masking, a cleaning, or a plating process. The non-horizontal cylindrical protrusions 1404 can be centered within the base areas 1406.

A primary integrated circuit device 1410 or a secondary integrated circuit device 1412 can be mounted over the panel 1402 and adjacent the non-horizontal cylindrical protrusions 1404 using the attachment material 332 in a mounting process. The primary integrated circuit device 1410 or the secondary integrated circuit device 1412 can be a copy of the integrated circuit device 404 of FIG. 4.

The non-horizontal cylindrical protrusions 1404 can surround the primary integrated circuit device 1410 or the secondary integrated circuit device 1412. The primary integrated circuit device 1410 or the secondary integrated circuit device 1412 can be attached directly on a primary side of the attachment material 332.

A secondary side (not shown) of the attachment material 332 opposite the primary side can be attached directly on the component side. The bond wires 428 can be attached directly on a portion of the electrically conductive layer 1408 closest to the primary integrated circuit device 1410 or the secondary integrated circuit device 1412 and directly to active circuitry of the primary integrated circuit device 1410 or the secondary integrated circuit device 1412, respectively, using a bonding process.

Figure 15:
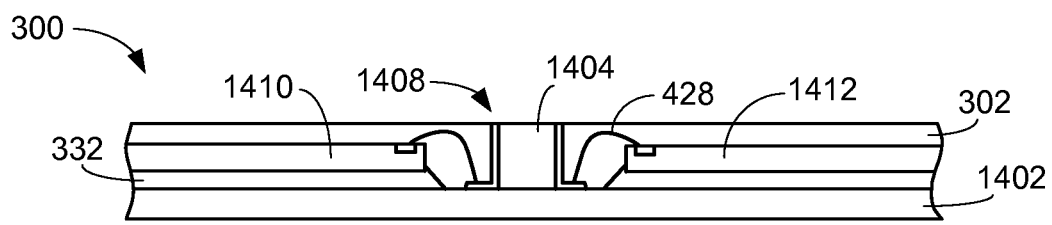
FIG. 15 is a portion of a cross-sectional view of the integrated circuit packaging system of FIG. 3 in a molding phase.

Referring now to FIG. 15, therein is shown a portion of a cross-sectional view of the integrated circuit packaging system 300 of FIG. 3 in a molding phase. The bond wires 428, the primary integrated circuit device 1410, the secondary integrated circuit device 1412, portions of the attachment material 332, and the electrically conductive layer 1408 exposed over the component side of the panel 1402 can be covered with the encapsulation 302 using a molding process. An end of the non-horizontal cylindrical protrusions 1404 exposed from the electrically conductive layer 1408 is exposed from the encapsulation 302 during the molding process.

Figure 16:
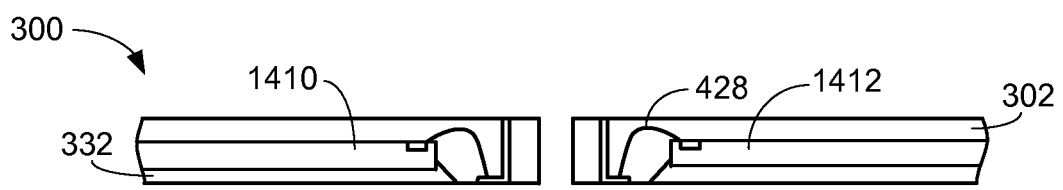
FIG. 16 is the cross-sectional view of FIG. 15 in a separation phase.

Referring now to FIG. 16, therein is shown the cross-sectional view of FIG. 15 in a separation phase. The non-horizontal cylindrical protrusions 1404 of FIG. 15 and the panel 1402 of FIG. 15 can be removed from the encapsulation 302, the attachment material 332, and the electrically conductive layer 1408 of FIG. 15 during a removal phase. The removal phase can include etching, grinding, drilling, copper stripetching, sanding, or equivalent removal processes. Copper can be etched from the electrically conductive layer 1408 and the integrated circuit packaging system 300.

The electrically conductive layer 1408 and the encapsulation 302 can be separated along a line parallel to the primary integrated circuit device 1410 and the secondary integrated circuit device 1412. The primary integrated circuit device 1410 can be separated from the secondary integrated circuit device using a separation process with the primary integrated circuit device 1410 and the secondary integrated circuit device 1412 each directly connected by the bond wires 428 to a portion of the electrically conductive layer 1408 identical to the posts 306 of FIG. 3.

The separation process can include a cutting process, a sawing processing, a grinding process, a saw singulation process, a cleaning process, or any combination thereof. The separation process results in the formation of at least one copy of the integrated circuit packaging system 300 of FIG. 3.

Figure 17:
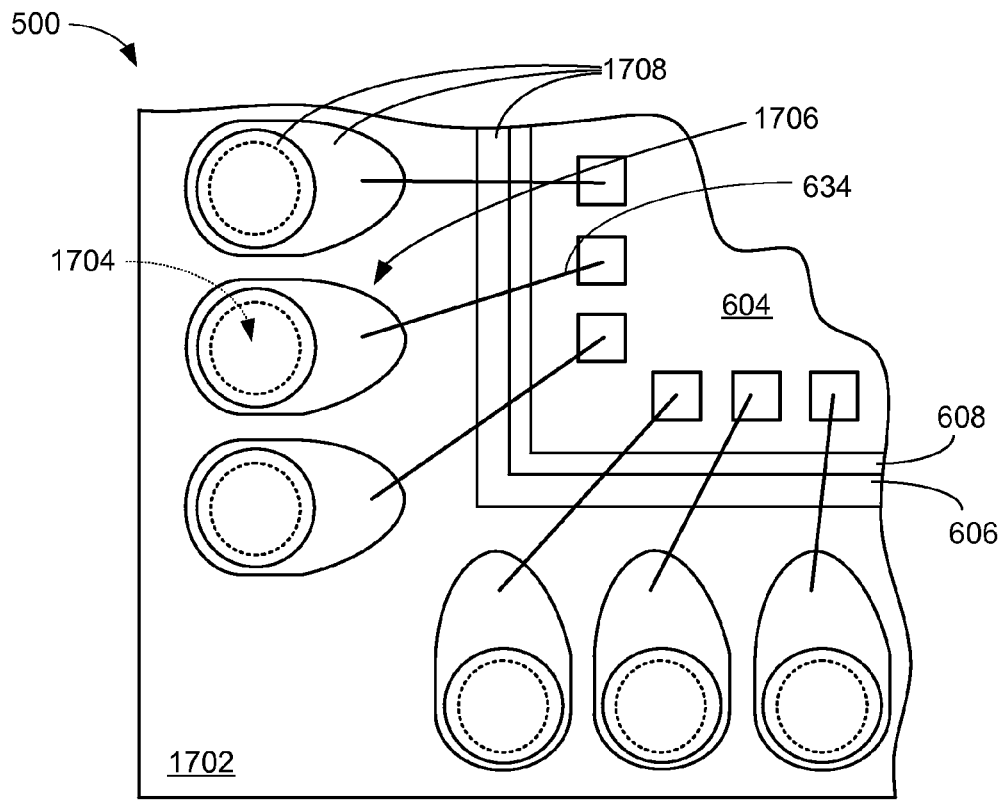
FIG. 17 is a portion of a top view of the integrated circuit packaging system of FIG. 5 in a connecting phase of manufacturing.

Referring now to FIG. 17, therein is shown a portion of a top view of the integrated circuit packaging system 500 of FIG. 5 in a connecting phase of manufacturing. Shown is an enlarged view of a portion of a panel 1702 formed from an etchable material that can include a copper or a copper alloy.

The panel 1702 can include non-horizontal cylindrical protrusions 1704, shown with dashed lines, formed of the etchable material and protruding from a component side of the panel 1702.

The non-horizontal cylindrical protrusions 1704 and base areas 1706 on the component side surrounding each of the non-horizontal cylindrical protrusions 1704 can be integrally covered with an electrically conductive layer 1708 that can include a pre-plating of the electrically conductive material using any combination of a masking, a cleaning, or a plating process. The electrically conductive layer 1708 can be used to form the component panel 606 in a component region similar to the component region 528 of FIG. 5. The component panel 606 is formed directly on the component side using the plating process.

The standoff contact 520 of FIG. 5 and the component contact 530 of FIG. 5 can also be formed using the electrically conductive layer 1708. The plating process can be used to form the standoff contact 520 and the component contact 530 directly on a side of the panel 1702 opposite the component side.

The integrated circuit device 604 can be mounted over the component panel 606 and adjacent the non-horizontal cylindrical protrusions 1704 using the mount material 608 in a mounting process. The mount material 608 can have an area that is between ninety and seventy-five percent smaller than an area of the component panel 606.

The integrated circuit device 604 is attached directly on a primary side of the mount material 608. A secondary side (not shown) of the mount material 608 opposite the primary side can be attached directly on the component side. The bond wires 634 can be attached directly on a portion of the electrically conductive layer 1708 closest to the integrated circuit device 604 and directly to active circuitry of the integrated circuit device 604 using a bonding process.

Figure 18:
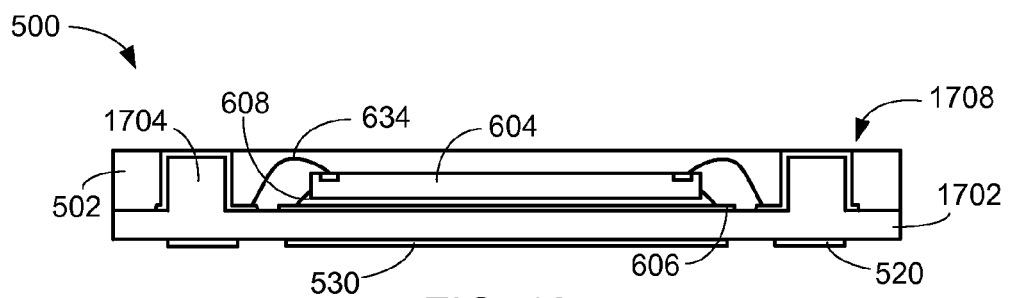
FIG. 18 is a cross-sectional view of FIG. 5 in a molding phase.

Referring now to FIG. 18, therein is shown a cross-sectional view of FIG. 5 in a molding phase. The component contact 530 and the standoff contact 520 are shown on the side of the panel 1702 opposite the component side. The area of the component contact 530 can be between seventy-five and eighty-five percent smaller than the area of the component panel 606.

The bond wires 634, the integrated circuit device 604, portions of the mount material 608, portions of the component panel 606, and the electrically conductive layer 1708 exposed over the component side of the panel 1702 can be covered with the encapsulation 502 using a molding process. A portion of the electrically conductive layer 1708 directly over the non-horizontal cylindrical protrusions 1704, the side of the panel 1702 opposite the component side, and ends of the panel 1702 are exposed from the encapsulation 502.

Figure 19:
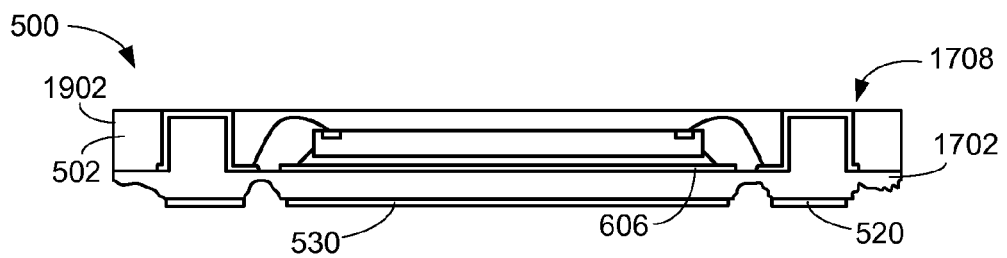
FIG. 19 is the cross-sectional view of FIG. 18 in a removal phase.

Referring now to FIG. 19, therein is shown the cross-sectional view of FIG. 18 in a removal phase. Portions of the panel 1702 directly between the component contact 530 and the standoff contact 520 can be removed to expose portions of the encapsulation 502, of the component panel 606, or of the electrically conductive layer 1708 during the removal phase. A controlled etching exposure can be used to etch copper away from the non-horizontal cylindrical protrusions 1704 to leave the non-horizontal cylindrical protrusions 1704 remaining and intact.

Portions of the panel 1702 directly between the standoff contact 520 and a plane formed by a peripheral side 1902 of the encapsulation 502 closest to the standoff contact 520 can be removed to expose portions of the encapsulation 502 or of the electrically conductive layer 1708 during the removal phase. The integrated circuit packaging system 500 of FIG. 5 can be formed as a result of the removal phase.

Figure 20:
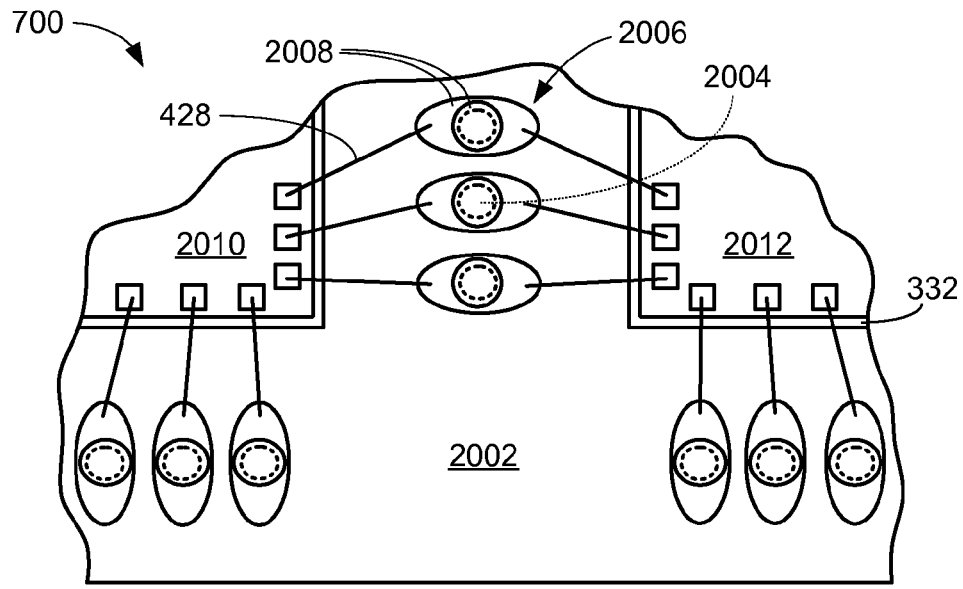
FIG. 20 is a portion of a top view of the integrated circuit packaging system of FIG. 7 in a connecting phase of manufacturing.

Referring now to FIG. 20, therein is shown a portion of a top view of the integrated circuit packaging system 700 of FIG. 7 in a connecting phase of manufacturing. Shown is an enlarged view of a portion of a panel 2002 formed from an etchable material that can include a copper or copper alloy. The panel 2002 can include non-horizontal cylindrical protrusions 2004, shown with dashed lines, formed of the etchable material and protruding from a component side of the panel 2002.

The non-horizontal cylindrical protrusions 2004 and base areas 2006 on the component side surrounding each of the non-horizontal cylindrical protrusions 2004 can be integrally covered with an electrically conductive layer 2008 that can include the electrically conductive material using any combination of a masking, a cleaning, or a plating process. The non-horizontal cylindrical protrusions 2004 can be centered within the base areas 2006 under the electrically conductive layer 2008.

A primary integrated circuit device 2010 or a secondary integrated circuit device 2012 can be mounted over the panel 2002 and adjacent the non-horizontal cylindrical protrusions 2004 using the attachment material 332 in a mounting process. The primary integrated circuit device 2010 or the secondary integrated circuit device 2012 can be a copy of the integrated circuit device 404 of FIG. 8.

The non-horizontal cylindrical protrusions 2004 covered with the electrically conductive layer 2008 can surround the primary integrated circuit device 2010 or the secondary integrated circuit device 2012. The primary integrated circuit device 2010 or the secondary integrated circuit device 2012 can be attached directly on the attachment material 332.

The attachment material 332 can be attached directly on the component side. The bond wires 428 can be attached directly on a portion of the electrically conductive layer 2008 closest to the primary integrated circuit device 2010 or the secondary integrated circuit device 2012 and directly to active circuitry of the primary integrated circuit device 2010 or the secondary integrated circuit device 2012, respectively, using a bonding process.

Figure 21:
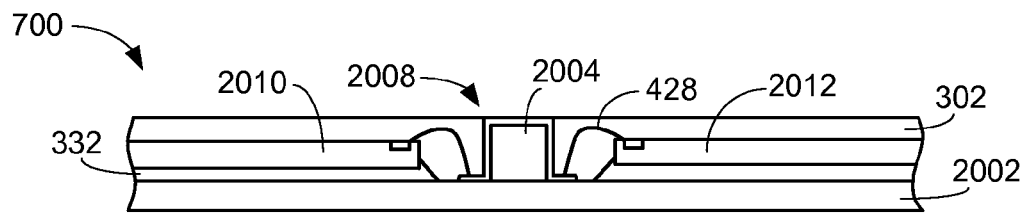
FIG. 21 is a portion of a cross-sectional view of the integrated circuit packaging system of FIG. 7 in a molding phase.

Referring now to FIG. 21, therein is shown a portion of a cross-sectional view of the integrated circuit packaging system 700 of FIG. 7 in a molding phase. The bond wires 428, the primary integrated circuit device 2010, the secondary integrated circuit device 2012, portions of the attachment material 332, and the electrically conductive layer 2008 exposed over the component side of the panel 2002 can be covered with the encapsulation 302 using a molding process. The electrically conductive layer 2008 directly on and covering an end of the non-horizontal cylindrical protrusions 2004 is exposed from the encapsulation 302 during the molding process.

Figure 22:
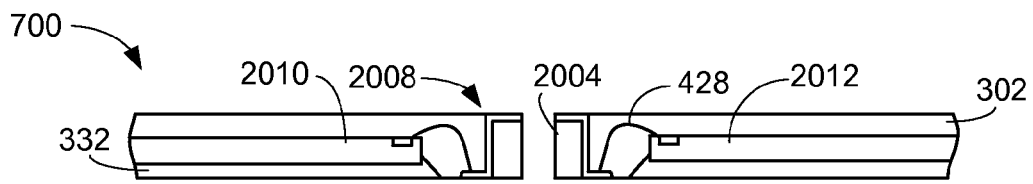
FIG. 22 is the cross-sectional view of FIG. 21 in a separation phase.

Referring now to FIG. 22, therein is shown the cross-sectional view of FIG. 21 in a separation phase. The panel 2002 of FIG. 21 can be removed to expose the encapsulation 302, the attachment material 332, and the electrically conductive layer 2008 containing the non-horizontal cylindrical protrusions 2004 during a removal phase. The removal phase can include etching, grinding, drilling, copper stripetching, sanding, or equivalent removal processes.

The electrically conductive layer 2008 containing the non-horizontal cylindrical protrusions 2004 can be separated along a line parallel to the primary integrated circuit device 2010 and the secondary integrated circuit device 2012. The primary integrated circuit device 2010 can be separated from the secondary integrated circuit device using a separation process with the primary integrated circuit device 2010 and the secondary integrated circuit device 2012 each directly connected by the bond wires 428 to a portion of the electrically conductive layer 2008 identical to the posts 306 of FIG. 3.

The separation process can include a cutting process, a sawing processing, a grinding process, a cleaning process, or any combination thereof. The separation process results in the formation of at least one copy of the integrated circuit packaging system 700 of FIG. 3.

Figure 23:
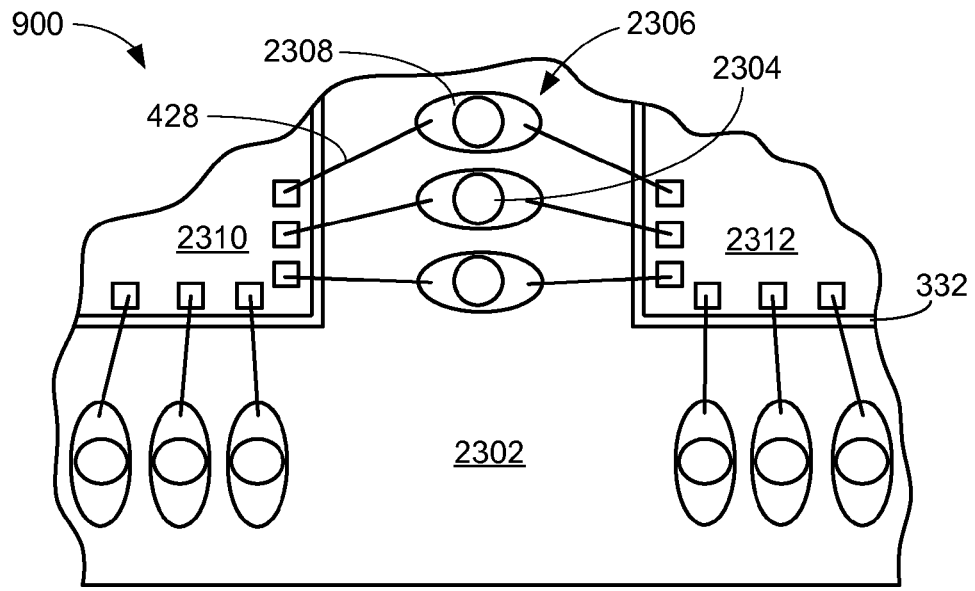
FIG. 23 is a portion of a top view of the integrated circuit packaging system of FIG. 9 in a connecting phase of manufacturing.

Referring now to FIG. 23, therein is shown a portion of a top view of the integrated circuit packaging system 900 of FIG. 9 in a connecting phase of manufacturing. Shown is an enlarged view of a portion of a panel 2302 formed from an etchable material that can include a copper or a copper alloy. The panel 2302 can include non-horizontal cylindrical protrusions 2304 formed from one or more layers of an electrically conductive etch-resistant layer 2308 that can include the electrically conductive etch-resistant material.

The non-horizontal cylindrical protrusions 2304 can be integrally formed directly on one or more layers of the electrically conductive etch-resistant layer 2308 in base areas 2306 using any combination of a masking, a cleaning, or a plating process. The non-horizontal cylindrical protrusions 2304 can protrude from a component side of the panel 2302 and can be centered within the electrically conductive etch-resistant layer 2308 in the base areas 2306.

A primary integrated circuit device 2310 or a secondary integrated circuit device 2312 can be mounted over the panel 2302 and adjacent the non-horizontal cylindrical protrusions 2304 and the electrically conductive etch-resistant layer 2308 in the base areas 2306 using the attachment material 332 in a mounting process. The primary integrated circuit device 2310 or the secondary integrated circuit device 2312 can be a copy of the integrated circuit device 404 of FIG. 10.

The non-horizontal cylindrical protrusions 2304 can surround the primary integrated circuit device 2310 or the secondary integrated circuit device 2312. The primary integrated circuit device 2310 or the secondary integrated circuit device 2312 can be attached directly on a primary side of the attachment material 332.

A secondary side (not shown) of the attachment material 332 opposite the primary side can be attached directly on the component side. The bond wires 428 can be attached directly on a portion of the electrically conductive etch-resistant layer 2308 closest to the primary integrated circuit device 2310 or the secondary integrated circuit device 2312 and directly to active circuitry of the primary integrated circuit device 2310 or the secondary integrated circuit device 2312, respectively, using a bonding process.

Figure 24:
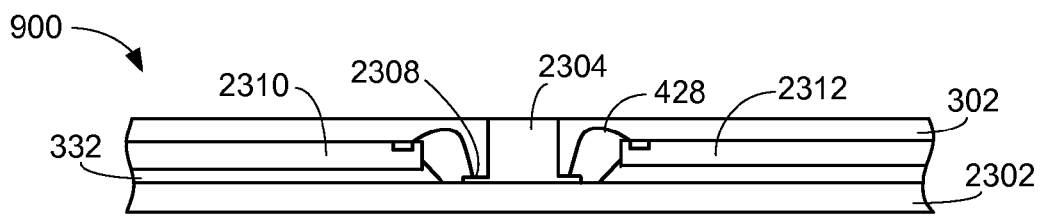
FIG. 24 is a portion of a cross-sectional view of the integrated circuit packaging system of FIG. 9 in a molding phase.

Referring now to FIG. 24, therein is shown a portion of a cross-sectional view of the integrated circuit packaging system 900 of FIG. 9 in a molding phase. The bond wires 428, the primary integrated circuit device 2310, the secondary integrated circuit device 2312, portions of the attachment material 332, and the electrically conductive etch-resistant layer 2308 can be covered with the encapsulation 302 using a molding process.

All but an end of the non-horizontal cylindrical protrusions 2304 over the electrically conductive etch-resistant layer 2308 can be covered with the encapsulation 302. The end of the non-horizontal cylindrical protrusions 2304 over the electrically conductive etch-resistant layer 2308 can be exposed and coplanar with a surface of the encapsulation 302 facing away from the panel 2302 as a result of the molding phase.

Figure 25:
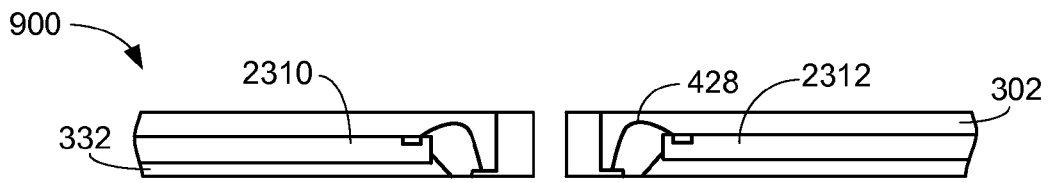
FIG. 25 is the cross-sectional view of FIG. 24 in a separation phase.

Referring now to FIG. 25, therein is shown the cross-sectional view of FIG. 24 in a separation phase. The non-horizontal cylindrical protrusions 2304 of FIG. 24 and the panel 2302 of FIG. 24 can be removed from the encapsulation 302, the attachment material 332, and the electrically conductive etch-resistant layer 2308 of FIG. 15 during a removal phase. The removal phase can include etching, grinding, drilling, copper stripetching, sanding, or equivalent removal processes.

The electrically conductive etch-resistant layer 2308 and the encapsulation 302 can be separated along a line parallel to the primary integrated circuit device 2310 and the secondary integrated circuit device 2312. The primary integrated circuit device 2310 can be separated from the secondary integrated circuit device using a separation process with the primary integrated circuit device 2310 and the secondary integrated circuit device 2312 each directly connected by the bond wires 428 to a portion of the electrically conductive etch-resistant layer 2308 identical to the posts 306 of FIG. 3.

The separation process can include a cutting process, a sawing processing, a grinding process, a cleaning process, or any combination thereof. The separation process results in the formation of at least one copy of the integrated circuit packaging system 900 of FIG. 10.

Figure 26:
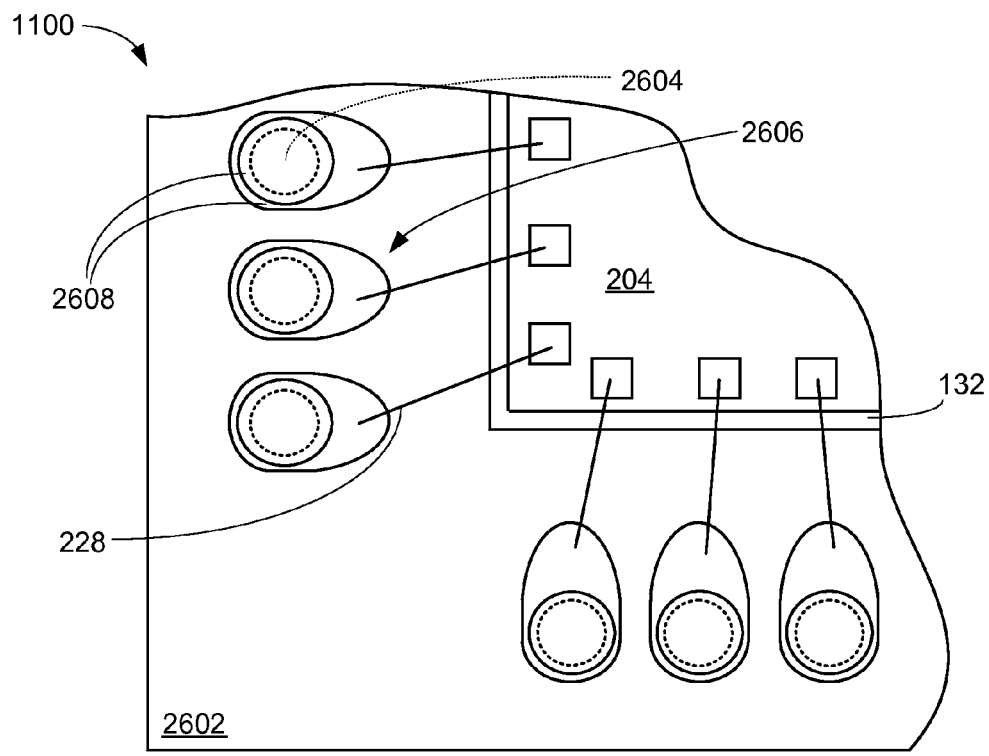
FIG. 26 is a portion of a top view of the integrated circuit packaging system of FIG. 11 in a connecting phase of manufacturing.

Referring now to FIG. 26, therein is shown a portion of a top view of the integrated circuit packaging system 1100 of FIG. 11 in a connecting phase of manufacturing. Shown is an enlarged view of a portion of a panel 2602 formed from an etchable material that can include a copper or a copper alloy. The panel 2602 can include non-horizontal cylindrical protrusions 2604, shown with dashed lines, formed of the etchable material and protruding from a component side of the panel 2602.

The non-horizontal cylindrical protrusions 2604 and base areas 2606 on the component side surrounding each of the non-horizontal cylindrical protrusions 2604 can be integrally covered with an electrically conductive layer 2608 that can include the electrically conductive material using any combination of a masking, a cleaning, or a plating process. The integrated circuit device 204 can be mounted over the panel 2602 and adjacent the non-horizontal cylindrical protrusions 2604 using the attachment material 132 in a mounting process.

The integrated circuit device 204 is attached directly on a primary side of the attachment material 132. A secondary side (not shown) of the attachment material 132 opposite the primary side can be attached directly on the component side. The bond wires 228 can be attached directly on a portion of the electrically conductive layer 2608 closest to the integrated circuit device 204 and directly to active circuitry of the integrated circuit device 204 using a bonding process.

Figure 27:
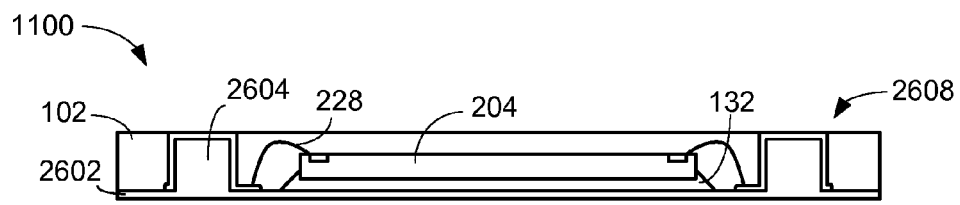
FIG. 27 is a cross-sectional view of FIG. 11 in a molding phase.

Referring now to FIG. 27, therein is shown a cross-sectional view of FIG. 11 in a molding phase. The bond wires 228, the integrated circuit device 204, portions of the attachment material 132, the electrically conductive layer 2608, and the component side of the panel 2602 can be covered with the encapsulation 102 using a molding process. A portion of the electrically conductive layer 2608 directly on an end of the non-horizontal cylindrical protrusions 2604 above the component side can be exposed from the encapsulation 102 during the molding process.

Figure 28:
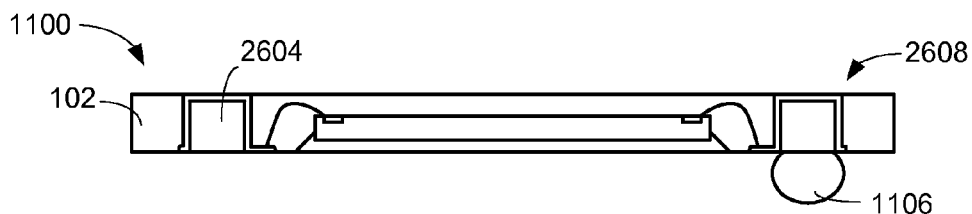
FIG. 28 is the cross-sectional view of FIG. 27 in a reflow phase.

Referring now to FIG. 28, therein is shown the cross-sectional view of FIG. 27 in a reflow phase. The panel 2602 of FIG. 27 can be removed from the encapsulation 102, the electrically conductive layer 2608, and the non-horizontal cylindrical protrusions 2604 during a removal phase. The removal phase can include etching, grinding, drilling, copper stripetching, sanding, or equivalent removal processes.

The system connector 1106 can be attached to an end of the non-horizontal cylindrical protrusions 2604 exposed from the electrically conductive layer 2608 during a reflow phase. The reflow phase can include a connecting process such as a solder reflow process with convection heating or laser energy.

Figure 29:
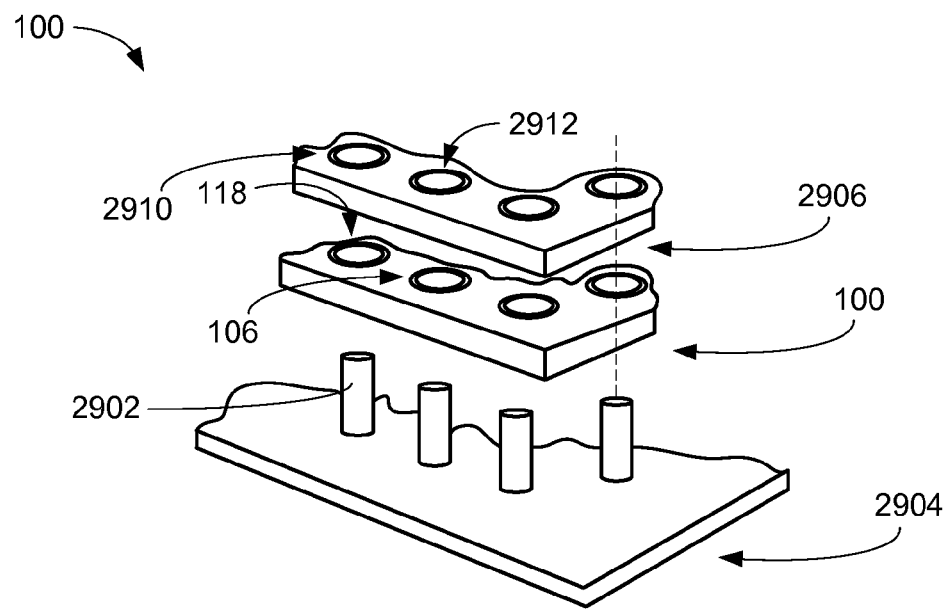
FIG. 29 is a detailed portion of an isometric view of the integrated circuit packaging system of FIG. 1 in a system integration phase.

Referring now to FIG. 29, therein is shown a detailed portion of an isometric view of the integrated circuit packaging system 100 of FIG. 1 in a system integration phase. Shown is an enlarged view of a portion of the integrated circuit packaging system 100 with centers of the posts 106 aligned with centers of pins 2902 electrically connected to a next level integration 2904 such as a printed circuit board, an interposer, or a component with circuitry. The through hole 118 of each of the posts 106 can provide connectivity between the integrated circuit packaging system 100 and the next level integration.

A stack package 2906 having posts 2910 with a through hole 2912 in a manner similar to the integrated circuit packaging system 100, the posts 106, and the through hole 118, respectively can be stacked over the integrated circuit packaging system 100. The pins 2902 can be directly connect to the through hole 2912 of the posts 2910 and the through hole 118 of the posts 106 to provide direct connectivity between the stack package 2906, the integrated circuit packaging system 100, and the next level integration.

This system integration phase described is just one example of an application of stacked packages using pins and holed. Other application examples using holed leads can include stacking packages using solder balls or solder paste that can result in a very low stacking stand-off profile. The hole can also capture solder in a way similar to a capture pad. A further application example using holed leads can include the holes used to interface with a balled device, flipchip die, or a device/package with electrodes of copper pillars and copper pillars perfectly matched to the holes.

Figure 30:
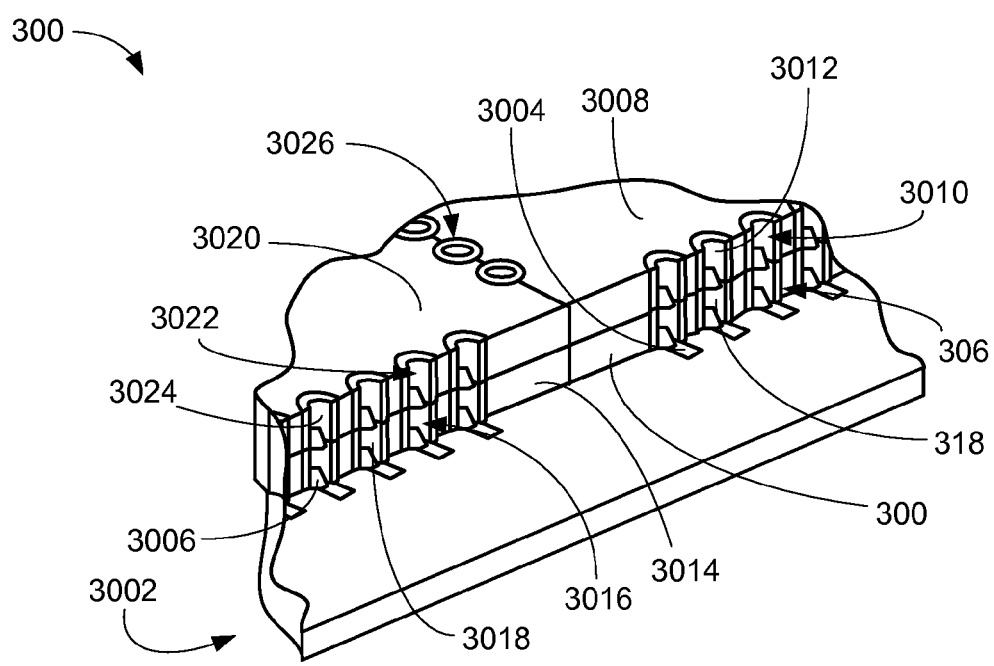
FIG. 30 is a detailed portion of an isometric view of the integrated circuit packaging system of FIG. 3 in a system integration phase.

Referring now to FIG. 30, therein is shown a detailed portion of an isometric view of the integrated circuit packaging system 300 of FIG. 3 in a system integration phase. Shown is an enlarged view of the integrated circuit packaging system 300 attached to a next level integration 3002 such as a printed circuit board, an interposer, or a component with circuitry.

The concave side 318 of the posts 306 can be attached to pads 3004 of the next level integration 3002 using solder 3006 to provide connectivity between the integrated circuit packaging system 300 and the next level integration 3002. A first stack package 3008 having posts 3010 with a concave side 3012 in a manner similar to the integrated circuit packaging system 300, the posts 306, and the concave side 318, respectively, can be connected to the integrated circuit packaging system 300 or the next level integration 3002.

The first stack package 3008 can include another of the integrated circuit packaging system 300, a wafer level chip scale package (WLCSP), a memory module, or a package with integrated circuitry. The concave side 3012 of the posts 3010 can be attached to the posts 306 and the concave side 318 using the solder 3006 to provide the connectivity between the first stack package 3008 and the integrated circuit packaging system 300 or the next level integration 3002.

A wafer level chip scale package 3014 can include posts 3016 with a concave side 3018 in a manner similar to the integrated circuit packaging system 300, the posts 306, and the concave side 318, respectively. The concave side 3018 of the posts 3016 can be attached to the pads 3004 of the next level integration 3002 using the solder 3006 to provide connectivity between the wafer level chip scale package 3014 and the next level integration 3002.

A second stack package 3020, similar to the first stack package 3008, can include posts 3022 with a concave side 3024 in a manner similar to the integrated circuit packaging system 300, the posts 306, and the concave side 318, respectively. The concave side 3024 of the posts 3022 can be attached to the posts 3016 and the concave side 3018 using the solder 3006 to provide the connectivity between the second stack package 3020 and the wafer level chip scale package 3014, the integrated circuit packaging system 300, the next level integration 3002, or the first stack package 3008.

A system package stack can be defined as the integrated circuit packaging system 300, the first stack package 3008, the wafer level chip scale package 3014, and the second stack package 3020. Abutment of the concave side 318, the concave side 3012, the concave side 3018, and the concave side 3024 can form a hole 3026 that can be filled with solder to provide connectivity between the next level integration 3002 and the system package stack. Configurations similar to the system package stack can also be referred to as a sideward integration and stacking configuration.

It has been discovered that the hole 3026 formed by posts with a concave side of the system stack can provide improved high speed signal performance characteristics between the system package stack and the next level integration 3002 over typical multiple stacked array input/output configurations.

Figure 31:
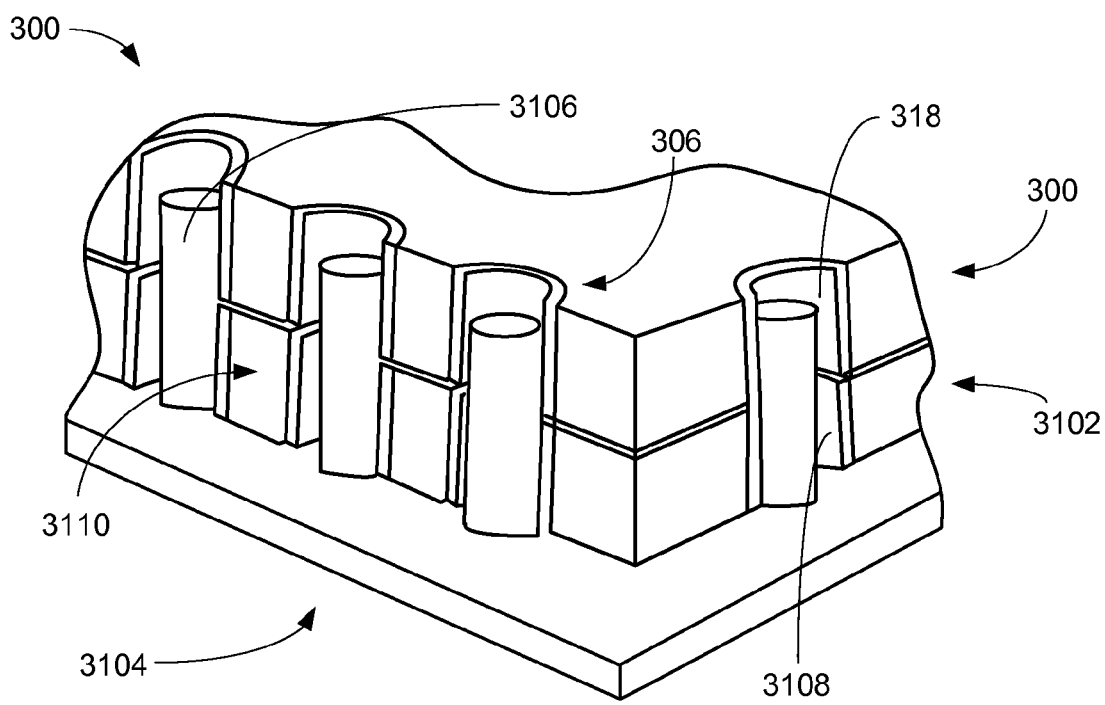
FIG. 31 is a detailed portion of an isometric view of the integrated circuit packaging system of FIG. 3 in an alternate system integration phase.

Referring now to FIG. 31, therein is shown a detailed portion of an isometric view of the integrated circuit packaging system 300 of FIG. 3 in an alternate system integration phase. Shown is an enlarged view of the integrated circuit packaging system 300 having connectivity to a base package 3102 and a next level integration 3104 such as a printed circuit board, an interposer, or a component with circuitry.

The base package 3102 can include posts 3110 with a concave side 3108 in a manner similar to the integrated circuit packaging system 300 with the posts 306 with the concave side 318, respectively. The contact pins 3106 protruding from the next level integration 3104 can be abutted to the concave side 3108 of the base package 3102 that can include a wafer level chip scale package (WLCSP), a memory module, or a package with integrated circuitry. All four sides (not shown) of the base package 3102 can include the posts 3110.

The integrated circuit packaging system 300 can be mounted over the base package 3102 with the posts 306 with the concave side 318 aligned and abutted to a portion of the contact pins 3106 extending above the base package 3102. The contact pins 3106 can provide connectivity between the integrated circuit packaging system 300, the base package 3102, and the next level integration 3104 and similar configurations of a stacked package.

It has been discovered that the concave side of the posts can provide a better alternative for solderless connectivity solutions and provide the benefits of plug and play, re-work, and recycle capabilities for multiple circuit package assemblies.

Figure 32:
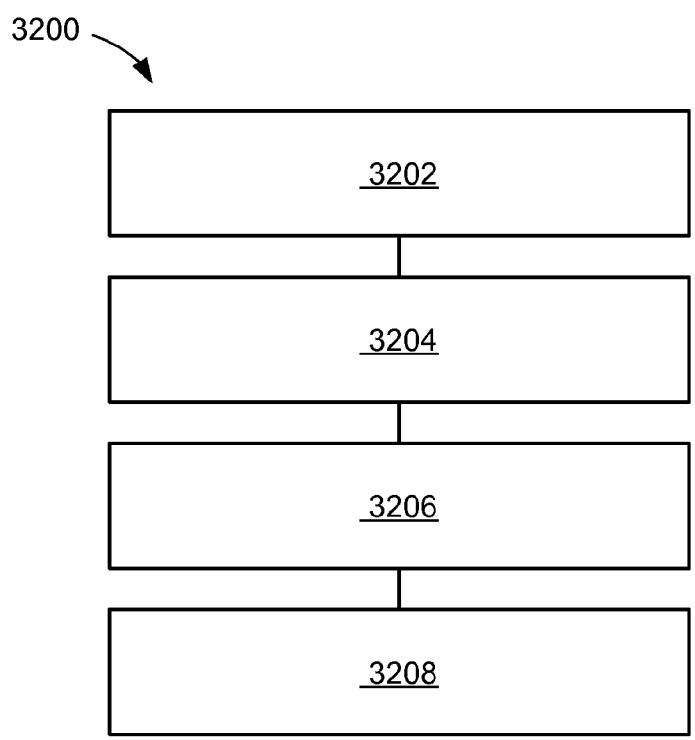
FIG. 32 is a flow chart of a method of manufacture of the integrated circuit packaging system in a further embodiment of the present invention.

Referring now to FIG. 32, therein is shown a flow chart of a method 3200 of manufacture of the integrated circuit packaging system 100 in a further embodiment of the present invention. The method 3200 includes: forming a post of multiple plating layers having a base end with an inward protrusion, a connect riser, and a top end opposite the base end in a block 3202; positioning an integrated circuit device having a perimeter end facing the connect riser and the inward protrusion in a block 3204; attaching a bond wire directly on the inward protrusion and the integrated circuit device in a block 3206; and applying an encapsulation over the integrated circuit device, the bond wire, the inward protrusion, and around the post, the encapsulation exposing a portion of the base end and the top end of the post in a block 3208.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit packaging system comprising;
    a post formed of multiple plating layers having a base end with an inward protrusion, a connect riser, and a top end opposite the base end, wherein the connect riser is an integral part of the base end;
    an integrated circuit device having a perimeter end facing the connect riser and the inward protrusion,
    a bond wire directly on the inward protrusion and the integrated circuit device;
    an encapsulation over the integrated circuit device, the bond wire, the inward protrusion, and around the post, a portion of the base end and the top end of the post exposed from the encapsulation, wherein the post includes a conductive protrusion extending from the base end and a portion of the conductive protrusion is exposed from the encapsulation, wherein the portion of the conductive protrusion exposed from the encapsulation is covered with a standoff contact, and wherein the encapsulation includes a component region in the encapsulation, the component region exposed from a base surface of the encapsulation; and
    a component protrusion that fills the component region exposed from the base surface of the encapsulation, the component protrusion extends above the base surface, wherein the component protrusion include a component contact, and wherein the component contact is coplanar with the standoff contact.

2. The system as claimed in claim 1 wherein the post includes the inward protrusion of the post formed to have a connect length greater than one-half the enclosed post width.

3. The system as claimed in claim 1 further comprising
    a next level integration having a pin;
    a stack package having another post; and
    connecting the pin in direct contact to the post and to the another post.

4. The system as claimed in claim 1 wherein the encapsulation around the post includes a concave side of the post exposed by the encapsulation.

5. The system as claimed in claim 1 wherein the post includes a through hole formed in the post.

* * * * *

UNITED STATES PATENT AND TRADEMARK OFFICE
CERTIFICATE OF CORRECTION

| | | |
|---|---|---|
| PATENT NO. | : 8,558,369 B2 | Page 1 of 1 |
| APPLICATION NO. | : 13/071514 | |
| DATED | : October 15, 2013 | |
| INVENTOR(S) | : Camacho et al. | |

It is certified that error appears in the above-identified patent and that said Letters Patent is hereby corrected as shown below:

On the Title Page, item (75), under "Inventors, delete "Frederick Rodriguez Gahilig," and insert therefor --Frederick Rodriguez Dahilig--

Signed and Sealed this
First Day of December, 2015

Michelle K. Lee
*Director of the United States Patent and Trademark Office*